US 9,385,729 B1
Jul. 5, 2016

(12) United States Patent
Levinger et al.

(10) Patent No.: US 9,385,729 B1
(45) Date of Patent: Jul. 5, 2016

(54) SYSTEM AND METHOD FOR CONTROLLING A PHASE LOCK LOOP

(71) Applicant: International Business Machines Corporation, Armonk, NY (US)

(72) Inventors: Run Levinger, Tel-Aviv (IL); Jakob Vovnoboy, Haifa (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/976,322

(22) Filed: Dec. 21, 2015

(51) Int. Cl.
*H03L 7/06* (2006.01)
*H03L 7/08* (2006.01)
*H03L 7/099* (2006.01)
*H03L 7/085* (2006.01)

(52) U.S. Cl.
CPC .............. *H03L 7/0805* (2013.01); *H03L 7/085* (2013.01); *H03L 7/099* (2013.01)

(58) Field of Classification Search
USPC ................................. 327/147–149, 156–158
See application file for complete search history.

(56) References Cited

U.S. PATENT DOCUMENTS

| 7,019,598 | B2 | 3/2006 | Duncan et al. | |
|---|---|---|---|---|
| 7,116,183 | B2 | 10/2006 | Wu | |
| 7,345,550 | B2 | 3/2008 | Bellaouar et al. | |
| 7,706,767 | B2 | 4/2010 | Wu | |
| 8,125,254 | B1 | 2/2012 | Ding | |
| 8,531,218 | B1 | 9/2013 | Chen | |
| 8,564,340 | B2 | 10/2013 | Liu et al. | |
| 2005/0046494 | A1* | 3/2005 | Lee | H03K 3/354 331/46 |
| 2005/0068117 | A1* | 3/2005 | Banerjee | H03L 1/00 331/117 FE |
| 2005/0231297 | A1 | 10/2005 | Aparin et al. | |
| 2006/0267693 | A1* | 11/2006 | Buell | H03L 7/10 331/16 |
| 2008/0007364 | A1* | 1/2008 | Chiba | H03B 5/1228 331/177 V |
| 2009/0085679 | A1 | 4/2009 | Jennings et al. | |
| 2010/0253402 | A1* | 10/2010 | Awata | G01S 19/29 327/156 |
| 2010/0264964 | A1* | 10/2010 | Furuta | H03L 7/0893 327/157 |
| 2011/0080199 | A1* | 4/2011 | Yen | H03L 7/093 327/157 |
| 2012/0146692 | A1* | 6/2012 | Yun | H03L 7/087 327/157 |
| 2013/0027101 | A1* | 1/2013 | Cherkassky | H03L 7/0995 327/157 |
| 2013/0257494 | A1* | 10/2013 | Nikaeen | H03M 3/458 327/156 |
| 2013/0300471 | A1* | 11/2013 | Yang | H03L 7/00 327/157 |
| 2013/0342247 | A1* | 12/2013 | Chern | H03L 7/0995 327/157 |
| 2015/0180414 | A1* | 6/2015 | Lee | H03B 7/06 327/157 |

(Continued)

OTHER PUBLICATIONS

Wang et al., "Continuously Auto-Tuned and Self-Ranged Dual-Path PLL Design with Hybrid AFC", IC Design & Technology (ICICDT), 2011 IEEE International Conference, May 2-4, 2011, pp. 1-4.

(Continued)

*Primary Examiner* — Adam Houston
(74) *Attorney, Agent, or Firm* — Cantor Colburn LLP; David Quinn

(57) ABSTRACT

A system includes: a phase frequency detector (PFD) having an output switchably connectable and disconnectable to a first signal path via a first switch, and switchably connectable and disconnectable to a second signal path via a second switch; a first filter disposed in the first signal path; a second filter disposed in the second signal path; and, a voltage controlled oscillator (VCO) operatively coupled to the first signal path downstream of the first filter, and operatively coupled to the second signal path downstream of the second filter. The VCO includes: a capacitive device or a current controlling device operatively coupled to the first signal path; and, a bulk terminal operatively coupled to the second signal path.

16 Claims, 4 Drawing Sheets

(56) References Cited

U.S. PATENT DOCUMENTS

| | | |
|---|---|---|
| 2015/0180486 A1 | 6/2015 | Shanan et al. |
| 2015/0372682 A1* | 12/2015 | Alexeyev .............. H03L 7/085 327/156 |
| 2016/0006442 A1* | 1/2016 | Lahiri .................. H03L 7/0893 327/157 |
| 2016/0036453 A1* | 2/2016 | Frank .................... H03L 1/023 327/156 |

OTHER PUBLICATIONS

Wu-Hsin Chen et al., "Self-Healing Phase-Locked Loops in Deep-Scaled CMOS Technologies", IEEE Design & Test of Computers, Nov./Dec. 2010, pp. 18-25.

* cited by examiner

US 9,385,729 B1

SYSTEM AND METHOD FOR CONTROLLING A PHASE LOCK LOOP

BACKGROUND

The present invention relates to a phase lock loop, and more specifically, to a system and method for controlling a phase lock loop having two or more control paths.

A phase lock loop (PLL) is a well-known electronic closed loop feedback control circuit typically used for frequency/timing control in a variety of applications. The PLL provides an output signal that is locked in phase of an input reference signal. A voltage controlled oscillator (VCO) is an integral part of the PLL that produces an output frequency signal that varies proportionally to a control voltage input to the VCO. To cover a wide frequency range and get low phase noise, stitched digital bands or one large band may be employed. However, the use of one large band may result in gain variation, and since the oscillation frequency of the VCO may drift with variation in temperature or fabrication processes, a large overlap between the stitched bands may be needed to account for the frequency drift, but such a design may affect other performance characteristics of the PLL, such as tuning range or phase noise. Accordingly, and while existing PLLs may be suitable for their intended purpose, the art of PLLs may be advanced by using alternative methods of controlling the VCO within the PLL.

SUMMARY

According to an embodiment of the present invention, a system includes: a phase frequency detector (PFD) having an output switchably connectable and disconnectable to a first signal path via a first switch, and switchably connectable and disconnectable to a second signal path via a second switch; a first filter disposed in the first signal path; a second filter disposed in the second signal path; and, a voltage controlled oscillator (VCO) operatively coupled to the first signal path downstream of the first filter, and operatively coupled to the second signal path downstream of the second filter. The VCO includes: a capacitive device or a current controlling device operatively coupled to the first signal path; and, a bulk terminal operatively coupled to the second signal path.

According to another embodiment of the present invention, a method of operating a phase locked loop, including: generating via a phase frequency detector (PFD) an output signal; switching closed a first signal path having a first filter, and permitting the output signal to transmit along the first signal path wherein the first filter filters the output signal and produces a first filtered control signal; switching closed a second signal path having a second filter, and permitting the output signal to transmit along the second signal path wherein the second filter filters the output signal and produces a second filtered control signal; applying the first filtered control signal to a capacitive device of a voltage controlled oscillator (VCO), wherein the first filtered control signal affects a capacitance of the capacitive device and an oscillating frequency of the VCO; and applying the second filtered control signal to a bulk terminal of the VCO, wherein the second filtered control signal affects a parasitic capacitance at the bulk terminal of the VCO and the oscillating frequency of the VCO

DETAILED DESCRIPTION

Figure 1:
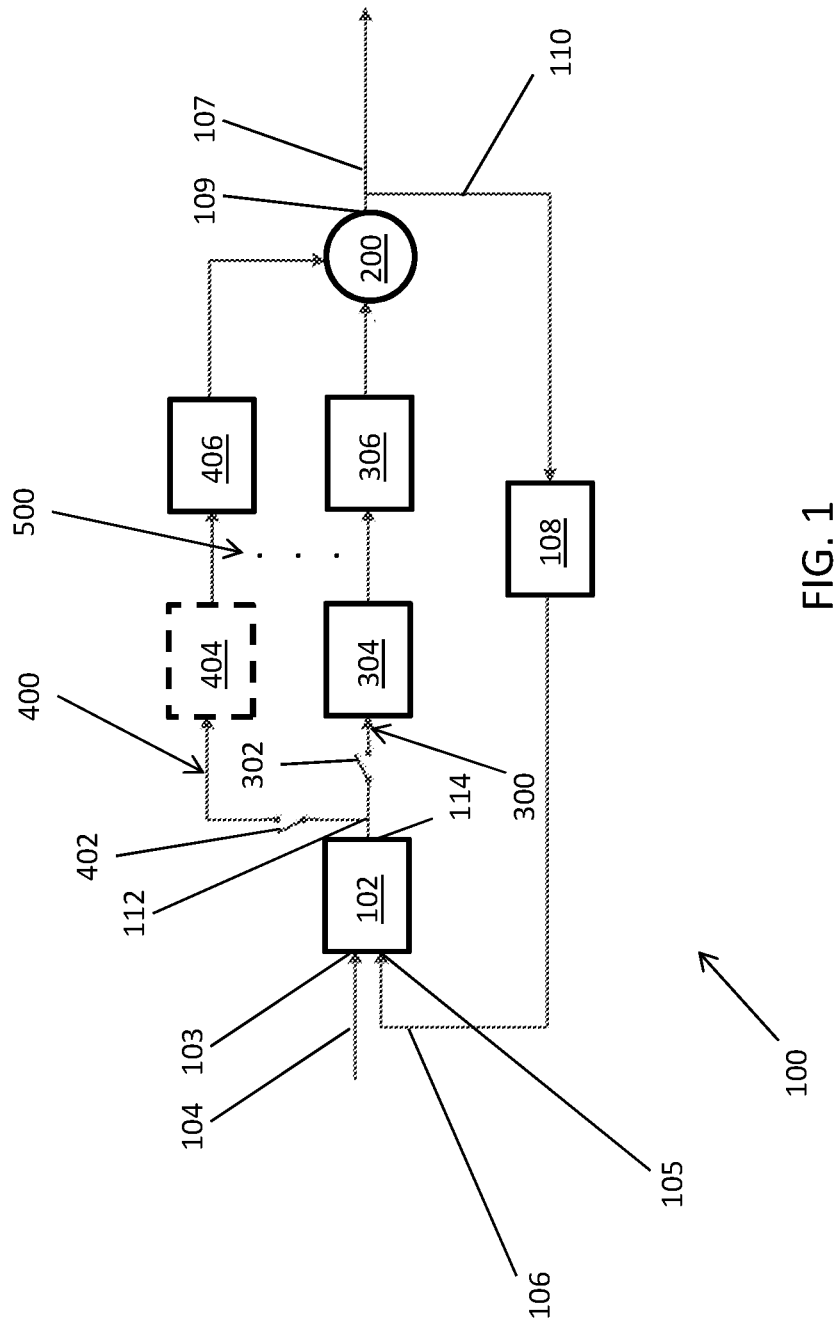
FIG. 1 depicts a block diagram of a PLL circuit in accordance with an embodiment of the invention.

FIG. 1 depicts a block diagram of a phase lock loop (PLL) circuit 100 in accordance with an embodiment. A phase frequency detector (PFD) 102 receives at a reference input 103 a reference signal 104, which may be a clock signal or any other type of signal that the PLL circuit 100 is tracking, and receives at a feedback input 105 a feedback signal 106 from a divider element 108, which reduces the frequency of an output signal 107, from an output 109 of a voltage controlled oscillator (VCO) 200, on the feedback signal path 110. The PFD 102 determines a difference in phase and frequency between the reference signal 104 and the feedback signal 106, and outputs an "up" or "down" control signal 112 based on whether the frequency of the feedback signal 106 is lagging or leading the frequency of the reference signal 104. The output 114 of the PFD 102 is switchably connectable and disconnectable to a first signal path 300 via a first switch 302, and is switchably connectable and disconnectable to a second signal path 400 via a second switch 402. In an embodiment, the first signal path 300 has a first charge pump 304 downstream of the PFD 102, and a first loop filter 306 downstream of the first charge pump 304, that is, the first charge pump 304 is electrically disposed between the PFD 102 and the first loop filter 306. In an embodiment, the second signal path 400 optionally (depicted by dashed lines in the block diagram) has a second charge pump 404 downstream of the PFD 102, and a second loop filter 406 downstream of the optional second charge pump 404, that is, the optional second charge pump 404 is electrically disposed between the PFD 102 and the second loop filter 406. The first charge pump 304 and the optional second charge pump 404 control a magnitude of charge stored in the respective first and second loop filters 306, 406, which in turn provide, respectively, a first control voltage 308 and a second control voltage 408 (and 508) to the VCO 200, which is operatively coupled to the first signal path 300 downstream of the first loop filter 306, and is operatively coupled to the second signal path 400 downstream of the second loop filter 406. In an embodiment, the output 114 of the PFD 102 may be switchably connectable and disconnectable to a third or more signal path(s) similar to the second signal path 400 and electrically disposed in parallel with the second signal path 400, the existence of which being represented schematically by ellipses 500 in FIG. 1, the significance of which will be discussed further below.

Figure 2:
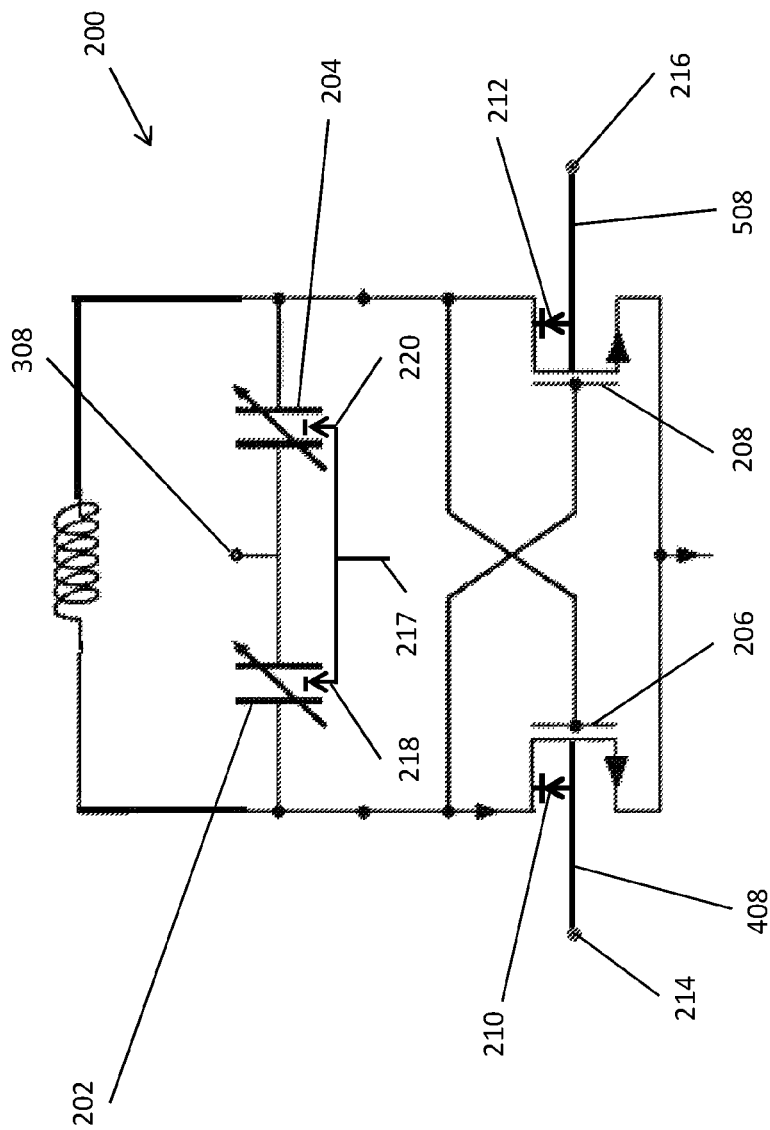
FIG. 2 depicts an example VCO circuit for use in the PLL of FIG. 1 in accordance with an embodiment of the invention.

Reference is now made to FIG. 2 in combination with FIG. 1, where FIG. 2 depicts an example VCO 200, which is exemplary only and not intended to be limiting to the scope of the invention disclosed herein. In an embodiment, the VCO 200 includes at least one metal-oxide-semiconductor (MOS) device such as varactors 202, 204, and transistors 206, 208 (each transistor 206, 208 is more generally herein also referred to as a current controlling device), a circuit arrangement for the example VCO 200 being well known in the art, including commonly used electrical symbols for inductors, varactors, transistors, and diodes for example, and requiring no further detailed description herein. Known in the art is a method of controlling an oscillating frequency of the VCO 200 by using a control voltage, the first control voltage 308 for example (also referred to in the art as Vtune), applied to the varactors 202, 204, or any other capacitive device of the VCO 200, which changes the capacitance of the varactors 202, 204, which affects the capacitance of the VCO 200 as a whole and hence the oscillation frequency of the VCO 200. As depicted in FIG. 1, the VCO is operatively coupled to the first signal path 300 to receive the first control voltage 308, and as depicted in FIG. 2 this first signal path 300, via the first control voltage 308, is operatively coupled to the varactors 202, 204. The output signal 107 from the VCO 200 has a frequency that varies proportionally to the input control voltage, first control voltage 308 or second control voltage 408 (and 508) depending on the state of the first and second switches 302, 402.

The VCO 200, and particularly the MOS transistors 206, 208, unavoidably have parasitic capacitances, which includes a parasitic capacitance of a parasitic drain-bulk diode at the bulk terminals 214, 216 of the transistors 206, 208. The parasitic diodes are depicted schematically in FIG. 2 by reference numerals 210, 212. By applying a secondary control voltage to the bulk terminals 214, 216 of the respective transistors 206, 208, the capacitances of the parasitic diodes 210, 212 will change, which affects the capacitance of the VCO 200 as a whole and hence the oscillation frequency of the VCO 200. In an embodiment, the capacitance of the parasitic diode varies according to the following equation:

$$C_{pn,diode} = C_{jo}/\text{SQRT}(1 \pm (V_{BD}/(V_{bi}(T))));$$

where: $C_{pn,diode}$=pn junction diode capacitance; $C_{jo}$=zero bias junction capacitance; $V_{BD}$=reverse bias voltage of the diode; and, $V_{bi}$=built-in potential as a function of temperature T.

As depicted in FIG. 1, the VCO is operatively coupled to the second signal path 400 to receive the second control voltage 408 (and 508), and as depicted in FIG. 2 this second signal path 400, via the second control voltage 408 (and 508), is operatively coupled to the bulk terminal 214 (and 216) of transistor 206 (and 208). Also depicted in FIG. 2 is another control voltage 217 applied to the bulk terminals 218 and 220 of the varactors 202 and 204, which may be provided by a third signal path, discussed above, electrically disposed in parallel with the second signal path 400 as depicted by the ellipses 500 in FIG. 1.

It will be appreciated from the foregoing that the number of auxiliary control paths to the VCO 200 may be varied depending on how many transistor bulk terminals the VCO 200 has for affecting the parasitic capacitances of the associated parasitic drain-bulk diodes. Any number of auxiliary control paths is contemplated and considered to be within the scope of the invention disclosed herein.

In an embodiment, the VCO 200 may operate in a first state with the first switch 302 open and the second switch 402 closed, may operate in a second state with the first switch 302 closed and the second switch 402 open, and may operate in a third state with the first switch 302 closed and the second switch 402 closed. The first state of operation may be useful for calibrating the PLL circuit 100 to compensate for temperature or process variations, the second state of operation may be useful for controlling a work cycle of the PLL circuit 100 after calibration, and the third state of operation may be useful for providing dual path control of the PLL circuit 100. In an embodiment operating in the third state of operation, the second signal path 400 may be used as a background path with slow constants that react when the first (normal) signal path 300 has reached its tuning limits. By selective switching of the first switch 302, the second switch 402, or other switches (represented by ellipses 500 for example), a dual or multi control path self-healing PLL may be achievable.

Figure 3:
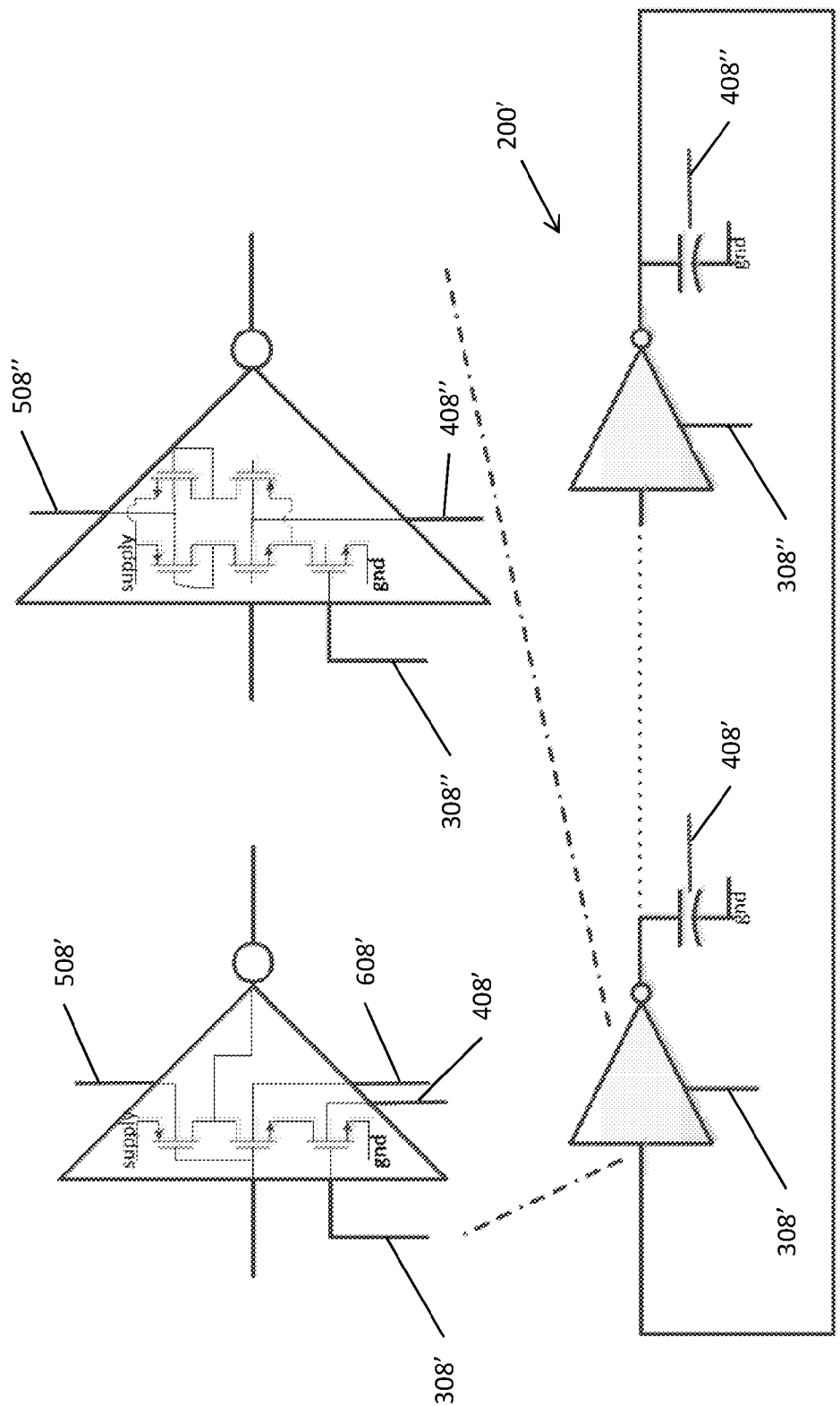
FIG. 3 depicts an example ring VCO circuit for use in the PLL of FIG. 1 in accordance with an embodiment of the invention.

Reference is now made to FIG. 3, which depicts an example ring VCO circuit 200' for use in the PLL 100 of FIG. 1 in accordance with an embodiment of the invention, where a first control voltage 308', 308" is synonymous with the first control voltage 308 of FIG. 2, the second control voltage 408', 408" is synonymous with the second control voltage 408 of FIG. 2, and the additional control voltages 508', 508" and 608' are synonymous with the additional control voltages via ellipses 500 of FIG. 1.

Figure 4:
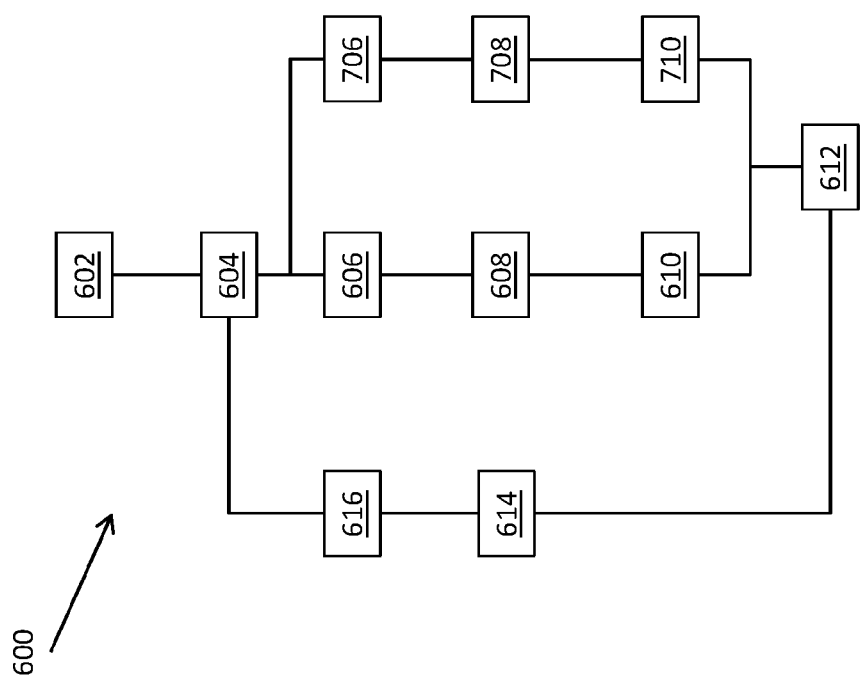
FIG. 4 depicts a flowchart of a method of operating a PLL circuit in accordance with an embodiment of the invention.

From the foregoing, it will be appreciated that an embodiment includes a method of operating a PLL circuit 100. For example, in an embodiment with reference to FIG. 4, a method 600 of operating a phase locked loop circuit 100, includes: generating 604 via a PFD 102 an output control signal 112; switching closed 606 a first signal path 300 having a first filter 306, and permitting the control signal to transmit along the first signal path 300 wherein the first filter 306 filters the control signal and produces a first filtered control signal (first control voltage) 308; switching closed 706 a second signal path 400 having a second filter 406, and permitting the control signal to transmit along the second signal path 400 wherein the second filter 406 filters the control signal and produces a second filtered control signal (second control voltage) 408 (and 508); applying 610 the first filtered control signal 308 to a varactor 202, 204 of a VCO 200, wherein the first filtered control signal 308 affects a capacitance of the varactor and an oscillating frequency of the VCO 200; and applying 710 the second filtered control signal 408 (and 508) to a bulk terminal 214 (and 216) of the VCO 200, wherein the second filtered control signal 408 (and 508) affects a parasitic capacitance at the bulk terminal 214 (and 216) of the VCO 200 and the oscillating frequency of the VCO 200.

In an embodiment, the method of operating the PLL circuit 100 includes the first filtered control signal 308 and the second filtered control signal 408 (and 508) being applied concurrently with each other.

In an embodiment, the method of operating the PLL circuit 100 includes the first filtered control signal 308 and the second filtered control signal 408 (and 508) are applied independently of each other.

In an embodiment, the method of operating the PLL circuit 100 includes: generating 612 via the VCO 200 an output signal 107; providing 614 the output signal 107 of the VCO 200 to the PFD 102 via a feedback signal path 110; and providing 602 a reference signal 104 to the PFD 102.

In an embodiment, the method of operating the PLL circuit 100 includes: reducing 616 a frequency of the output signal 107 of the VCO 200 in the feedback signal path 110, and providing the reduced frequency feedback signal 106 to the PFD 102.

In an embodiment, the method of operating the PLL circuit 100 includes: controlling 608 a magnitude of charge of the control signal 112 in the first signal path 300 via a first charge pump 304.

In an embodiment, the method of operating the PLL circuit 100 includes: controlling 708 a magnitude of charge of the control signal 112 in the second signal path 400 via a second charge pump 404.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
a phase frequency detector (PFD) comprising an output switchably connectable and disconnectable to a first signal path via a first switch, and switchably connectable and disconnectable to a second signal path via a second switch;
a first filter disposed in the first signal path;
a second filter disposed in the second signal path;
a voltage controlled oscillator (VCO) operatively coupled to the first signal path downstream of the first filter, and operatively coupled to the second signal path downstream of the second filter, the VCO comprising:
a capacitive device or a current controlling device operatively coupled to the first signal path; and
a bulk terminal operatively coupled to the second signal path.

2. The system of claim 1, wherein:
the PFD further comprises a reference input and a feedback input; and
the VCO further comprises an output operatively coupled to the feedback input via a feedback signal path.

3. The system of claim 1, wherein:
at least one of the first signal path or the second signal path comprises a charge pump disposed between the PFD and the respective filter.

4. The system of claim 1, wherein:
the first signal path and the second signal path each comprise a charge pump disposed between the PFD and the respective filter.

5. The system of claim 1, wherein:
the capacitive device comprises a varactor; and
the current controlling device comprises a transistor.

6. The system of claim 2, wherein:
the feedback signal path comprises a divider that reduces a frequency of an output signal of the VCO.

7. The system of claim 2, wherein:
the VCO comprises a metal-oxide-semiconductor device comprising parasitic capacitance at the bulk terminal.

8. The system of claim 2, wherein:
the VCO operates in a first state with the first switch open and the second switch closed, and operates in a second state with the first switch closed and the second switch open.

9. The system of claim 8, wherein:
the VCO operates in a third state with the first switch closed and the second switch closed.

10. A method of operating a phase locked loop, comprising:
generating via a phase frequency detector (PFD) an output signal;
switching closed a first signal path having a first filter, and permitting the output signal to transmit along the first signal path wherein the first filter filters the output signal and produces a first filtered control signal;
switching closed a second signal path having a second filter, and permitting the output signal to transmit along the second signal path wherein the second filter filters the output signal and produces a second filtered control signal;
applying the first filtered control signal to a capacitive device of a voltage controlled oscillator (VCO), wherein the first filtered control signal affects a capacitance of the capacitive device and an oscillating frequency of the VCO; and
applying the second filtered control signal to a bulk terminal of the VCO, wherein the second filtered control signal affects a parasitic capacitance at the bulk terminal of the VCO and the oscillating frequency of the VCO.

11. The method of claim 10, wherein:
the first filtered control signal and the second filtered control signal are applied concurrently with each other.

12. The method of claim 10, wherein:
the first filtered control signal and the second filtered control signal are applied independently of each other.

13. The method of claim 10, further comprising:
generating via the VCO an output signal;
providing the output signal of the VCO to the PFD via a feedback path; and
providing a reference signal to the PFD.

14. The method of claim 13, further comprising:
reducing a frequency of the output signal of the VCO in the feedback path, and providing the reduced frequency signal to the PFD.

15. The method of claim 13, further comprising:
controlling a magnitude of charge of the output signal in the first signal path via a first charge pump.

16. The method of claim 15, further comprising:
controlling a magnitude of charge of the output signal in the second signal path via a second charge pump.

* * * * *